(12) United States Patent
Basker et al.

(10) Patent No.: US 10,032,677 B2
(45) Date of Patent: Jul. 24, 2018

(54) METHOD AND STRUCTURE TO FABRICATE CLOSELY PACKED HYBRID NANOWIRES AT SCALED PITCH

(71) Applicant: International Business Machines Corporation, Armonk, NY (US)

(72) Inventors: Veeraraghavan S. Basker, Schenectady, NY (US); Zuoguang Liu, Schenectady, NY (US); Tenko Yamashita, Schenectady, NY (US); Chun-chen Yeh, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/443,527

(22) Filed: Feb. 27, 2017

(65) Prior Publication Data

US 2017/0170073 A1 Jun. 15, 2017

Related U.S. Application Data

(62) Division of application No. 14/850,154, filed on Sep. 10, 2015, now Pat. No. 9,607,900.

(51) Int. Cl.
*H01L 27/01* (2006.01)
*H01L 21/8238* (2006.01)
(Continued)

(52) U.S. Cl.
CPC .. *H01L 21/823807* (2013.01); *H01L 21/0217* (2013.01); *H01L 21/0226* (2013.01);
(Continued)

(58) Field of Classification Search
CPC ....... H01L 21/823807; H01L 21/02164; H01L 21/0217; H01L 21/0226; H01L 21/02381;
(Continued)

(56) References Cited

U.S. PATENT DOCUMENTS 7,611,938 B2 11/2009 Cheng et al.
8,232,165 B2 7/2012 Chidambarrao et al.
(Continued)

OTHER PUBLICATIONS

S. Bangsaruntip et al., "High Performance and Highly Uniform Gate-All-Around Silicon Nanowire MOSFETs with Wire Size Dependent Scaling," IEEE International Electron Devices Meeting (IEDM), Dec. 2009, 4 pages.
(Continued)

*Primary Examiner* — Tu-Tu Ho
(74) *Attorney, Agent, or Firm* — Vazken Alexanian; Michael J. Chang, LLC

(57) ABSTRACT

Techniques for forming closely packed hybrid nanowires are provided. In one aspect, a method for forming hybrid nanowires includes: forming alternating layers of a first and a second material in a stack on a substrate; forming a first trench(es) and a second trench(es) in the stack; laterally etching the layer of the second material selectively within the first trench(es) to form first cavities in the layer; growing a first epitaxial material within the first trench(es) filling the first cavities; laterally etching the layer of the second material selectively within the second trench(es) to form second cavities in the layer; growing a second epitaxial material within the second trench(es) filling the second cavities, wherein the first epitaxial material in the first cavities and the second epitaxial material in the second cavities are the hybrid nanowires. A nanowire FET device and method for formation thereof are also provided.

18 Claims, 13 Drawing Sheets

(51) Int. Cl.

| | |
|---|---|
| *H01L 29/66* | (2006.01) |
| *H01L 21/02* | (2006.01) |
| *H01L 21/308* | (2006.01) |
| *H01L 21/306* | (2006.01) |
| *H01L 21/283* | (2006.01) |
| *H01L 21/311* | (2006.01) |
| *H01L 27/092* | (2006.01) |
| *H01L 29/06* | (2006.01) |
| *H01L 29/201* | (2006.01) |
| *H01L 29/78* | (2006.01) |
| *H01L 29/423* | (2006.01) |
| *H01L 29/49* | (2006.01) |
| *H01L 29/786* | (2006.01) |

(52) U.S. Cl.
CPC .... *H01L 21/0254* (2013.01); *H01L 21/02164* (2013.01); *H01L 21/02381* (2013.01); *H01L 21/02532* (2013.01); *H01L 21/02538* (2013.01); *H01L 21/02543* (2013.01); *H01L 21/02546* (2013.01); *H01L 21/02549* (2013.01); *H01L 21/02603* (2013.01); *H01L 21/02636* (2013.01); *H01L 21/02639* (2013.01); *H01L 21/283* (2013.01); *H01L 21/3085* (2013.01); *H01L 21/30604* (2013.01); *H01L 21/30612* (2013.01); *H01L 21/31116* (2013.01); *H01L 21/823814* (2013.01); *H01L 27/092* (2013.01); *H01L 29/0673* (2013.01); *H01L 29/0676* (2013.01); *H01L 29/201* (2013.01); *H01L 29/42392* (2013.01); *H01L 29/4908* (2013.01); *H01L 29/66522* (2013.01); *H01L 29/66545* (2013.01); *H01L 29/66795* (2013.01); *H01L 29/78* (2013.01); *H01L 29/78618* (2013.01); *H01L 29/78651* (2013.01); *H01L 29/78681* (2013.01); *H01L 29/78684* (2013.01); *H01L 29/78696* (2013.01); *H01L 21/823842* (2013.01)

(58) Field of Classification Search
CPC ......... H01L 21/02538; H01L 21/02543; H01L 21/02546; H01L 21/02636; H01L 21/283; H01L 21/30612; H01L 21/3085; H01L 21/31116; H01L 21/823814; H01L 27/092; H01L 29/0673; H01L 29/0676; H01L 29/201; H01L 29/66522; H01L 29/66545; H01L 29/78; H01L 29/78684; H01L 29/78696
USPC ....................................................... 257/351
See application file for complete search history.

(56) References Cited

U.S. PATENT DOCUMENTS

| | | | |
|---|---|---|---|
| 8,324,940 | B2 | 12/2012 | Bangsaruntip et al. |
| 8,384,065 | B2 | 2/2013 | Bangsaruntip et al. |
| 8,486,776 | B2 | 7/2013 | Bedell et al. |
| 8,536,029 | B1 | 9/2013 | Chang et al. |
| 2009/0242869 | A1* | 10/2009 | Hovel ............... B82Y 10/00 257/13 |
| 2013/0026449 | A1 | 1/2013 | Bangsaruntip et al. |
| 2013/0320294 | A1 | 12/2013 | Cappellani et al. |
| 2014/0151639 | A1 | 6/2014 | Chang et al. |
| 2014/0197377 | A1 | 7/2014 | Kim et al. |
| 2014/0231913 | A1 | 8/2014 | Leobandung |

OTHER PUBLICATIONS

S. Bangsaruntip et al., "Universality of Short-Channel Effects in Undoped-Body Silicon Nanowire MOSFETs," IEEE Electron Device Letters, vol. 31, No. 9, Sep. 2010, pp. 903-905.

C. Reyes-Betanzo et al., "Plasma etching of Silicon Nitride with High Selectivity over Silicon Oxide and Silicon in Fluorine Containing Plasmas," Vac. Sci. Technol. A 17 (6), 3179 (1999).

M. Schaepkens et al., "Study of the SiO2-to-Si3N4 etch selectivity mechanism in inductively coupled fluorocarbon plasmas and a comparison with the SiO2-to-Si mechanism," J. Vac. Sci. Technol. A 17(1), pp. 26-37, Jan./Feb. 1999.

Lele et al., "Role of CF2 in the etching of SiO2, Si3N4 and Si in fluorocarbon plasma," Journal of Semiconductors, vol. 30, No. 3, pp. 033005-1-033005-5 (Mar. 2009).

List of IBM Patents or Applications Treated as Related.

* cited by examiner

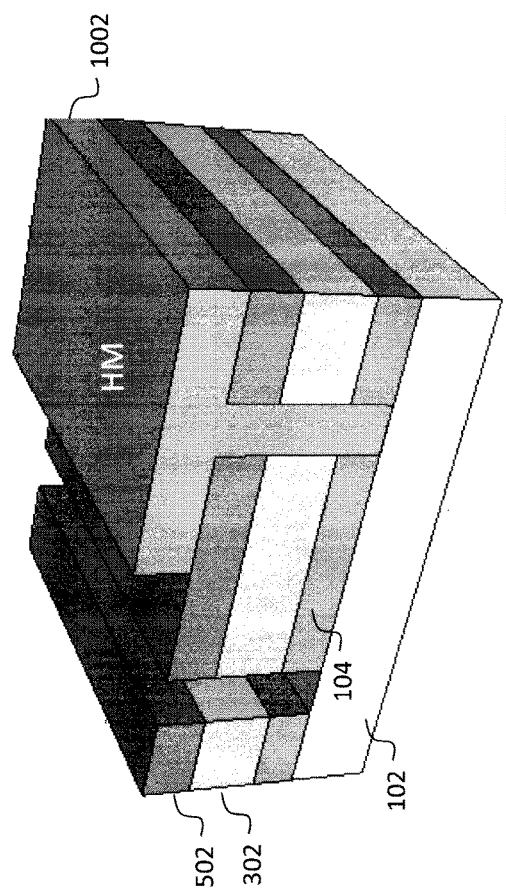
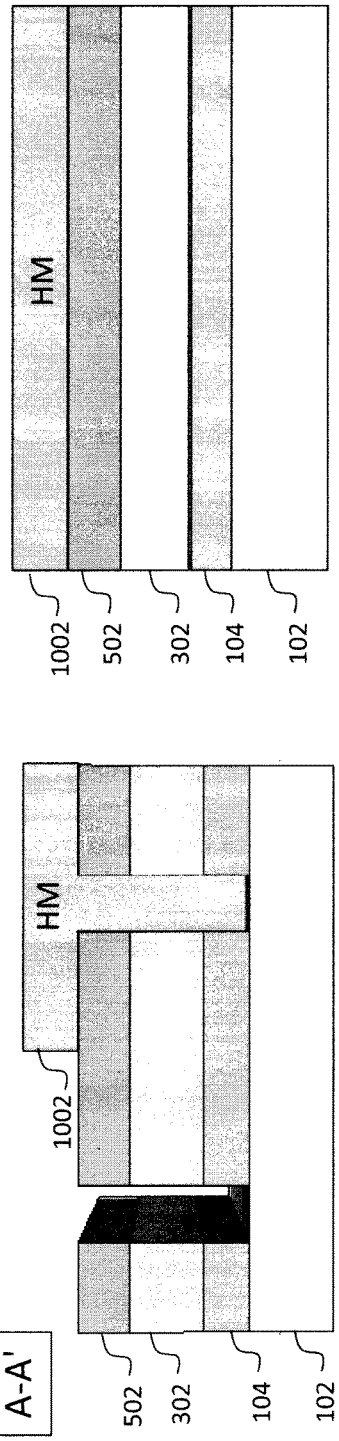
FIG. 10
FIG. 11
FIG. 12

METHOD AND STRUCTURE TO FABRICATE CLOSELY PACKED HYBRID NANOWIRES AT SCALED PITCH

CROSS-REFERENCE TO RELATED APPLICATION(S)

This application is a divisional of U.S. application Ser. No. 14/850,154 filed on Sep. 10, 2015, now U.S. Pat. No. 9,607,900, the disclosure of which is incorporated by reference herein.

FIELD OF THE INVENTION

The present invention relates to nanowire-based devices, and more particularly, to techniques for forming closely packed hybrid nanowires (i.e., nanowires formed from different materials) at a scaled pitch.

BACKGROUND OF THE INVENTION

Electron mobility is an important parameter to control in field effect transistors (FETs), especially for scaled devices where having a high mobility channel is considered to be the preferred option for scaled technology at the 7 nanometer node, and beyond. The issue of integrating different substrate material for n-channel FETs and p-channel FETs however becomes even more challenging when migrating to nanowire channel-based devices for maintaining electrostatics. To date, no effective way exists to make different nanowire channel materials altogether for use in a common device.

Thus, techniques for forming hybrid nanowires (i.e., nanowires formed from different materials) at a scaled pitch would be desirable.

SUMMARY OF THE INVENTION

The present invention provides techniques for forming closely packed hybrid nanowires (i.e., nanowires formed from different materials) at a scaled pitch. In one aspect of the invention, a method for forming hybrid nanowires is provided. The method includes the steps of: forming alternating layers of a first material and a second material in a stack on a substrate such that one of the layers of the second material is present in the stack between two of the layers of the first material, wherein the first material and the second material can be etched selective to one another; forming at least one first trench and at least one second trench in the stack; laterally etching the layer of the second material selectively within the at least one first trench to form first cavities in the layer of the second material adjacent to opposite sides of the at least one first trench; growing a first epitaxial material within the at least one first trench so as to fill the at least one first trench and the first cavities adjacent to the at least one first trench; laterally etching the layer of the second material selectively within the at least one second trench to form second cavities in the layer of the second material adjacent to opposite sides of the at least one second trench; growing a second epitaxial material within the at least one second trench so as to fill the at least one second trench and the second cavities adjacent to the at least one second trench, wherein the first epitaxial material in the first cavities and the second epitaxial material in the second cavities are the hybrid nanowires.

In another aspect of the invention, a method of forming a nanowire field-effect transistor (FET) device is provided. The method includes the steps of: forming at least one first pair of nanowires and at least one second pair of nanowires on a substrate, wherein the at least one first pair of nanowires is formed from a different material than the at least one second pair of nanowires; forming a first dummy gate over a portion of the at least one first pair of nanowires that serves as a channel region of a first nanowire FET and a second dummy gate over a portion of the at least one second pair of nanowires that serves as a channel region of a second nanowire FET, wherein portions of at least one first pair of nanowires on opposite sides of the first dummy gate serve as source and drain regions of the first nanowire FET, and wherein portions of at least one second pair of nanowires on opposite sides of the second dummy gate serve as source and drain regions of the second nanowire FET; doping the source and drain regions of the first nanowire FET and the source and drain regions of the second nanowire FET; depositing a dielectric surrounding the dummy gates; removing the first dummy gate and the second dummy gate, forming gate trenches in the dielectric; and forming replacement gates in the gate trenches.

In yet another aspect of the invention, a nanowire FET device is provided. The nanowire FET device includes: at least one first pair of nanowires and at least one second pair of nanowires on a substrate, wherein the at least one first pair of nanowires comprises a different material than the at least one second pair of nanowires; and a first gate over a portion of the at least one first pair of nanowires that serves as a channel region of a first nanowire FET and a second gate over a portion of the at least one second pair of nanowires that serves as a channel region of a second nanowire FET, wherein portions of at least one first pair of nanowires on opposite sides of the first dummy gate serve as source and drain regions of the first nanowire FET, and wherein portions of at least one second pair of nanowires on opposite sides of the second dummy gate serve as source and drain regions of the second nanowire FET, wherein the at least one first pair of nanowires comprises a material selected from the group consisting of: epitaxial silicon, epitaxial germanium, epitaxial silicon germanium, and an epitaxial III-V material, and wherein the at least one second pair of nanowires comprises another material selected from the group consisting of: epitaxial silicon, epitaxial germanium, epitaxial silicon germanium, and an epitaxial III-V material.

A more complete understanding of the present invention, as well as further features and advantages of the present invention, will be obtained by reference to the following detailed description and drawings.

BRIEF DESCRIPTION OF THE DRAWINGS

FIG. 10 is a three-dimensional diagram illustrating a hardmask having been formed blocking off the second trench according to an embodiment of the present invention;

FIG. 11 is a first cross-sectional diagram of the structure of FIG. 10 according to an embodiment of the present invention;

FIG. 12 is a second cross-sectional diagram of the structure of FIG. 10 according to an embodiment of the present invention;

DETAILED DESCRIPTION OF PREFERRED EMBODIMENTS

Provided herein are techniques for fabricating hybrid nanowires together on the same wafer from materials such as silicon (Si), silicon germanium (SiGe), and III-V materials, and for use of those hybrid nanowires in a gate last process for fabricating n- and p-channel field-effect transistors (FETs) on the wafer. The present process for forming hybrid nanowires generally involves first creating a stack of selectively etchable materials (e.g., an alternating stack of silicon nitride and silicon oxide layers) on the wafer, patterning trenches in the stack, and then using a lateral etch within the trenches to form cavities within the stack. The cavities can be filled with different materials such that when the stack is removed, what remains are nanowires made from these different materials. The term "hybrid nanowires," as used herein, generally refers to nanowires formed from at least two different materials. For instance when multiple nanowires are being formed, in accordance with the present techniques the term "hybrid nanowires" means that one or more of the nanowires are formed from a different material than another one or more of the nanowires. To use a simple example, hybrid nanowires can be fabricated on a common wafer using the present techniques wherein one or more of the nanowires is formed from silicon (Si) and another one or more of the nanowires is formed from silicon germanium (SiGe). The choice of a Si/SiGe combination is favorable since these nanowires can then be used as the basis to fabricate n-channel and p-channel nanowire FETs on the same wafer. However, as described in detail below, a variety of other nanowire material combinations are anticipated herein.

Figure 1:
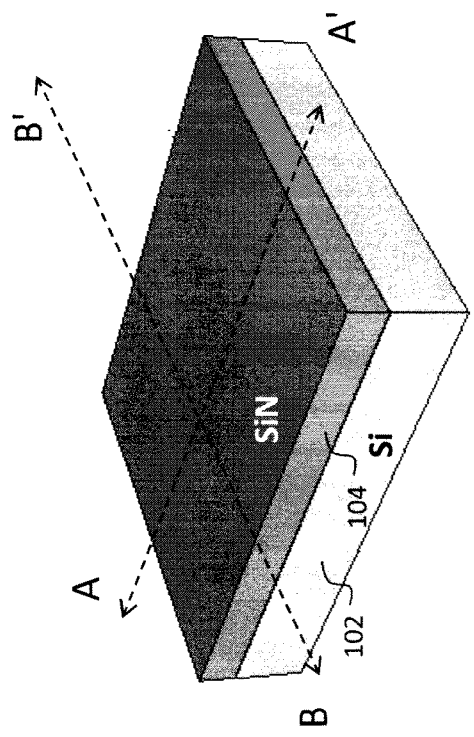
FIG. 1 is a three-dimensional diagram illustrating a layer of a first material (e.g., silicon nitride (SiN)) having been formed on a substrate according to an embodiment of the present invention.

A detailed description of the present process for fabricating hybrid nanowires on the same wafer is now provided by way of reference to FIGS. 1-33. As shown in FIG. 1, the process begins with a semiconductor substrate 102. According to an exemplary embodiment, substrate 102 is a silicon (Si) substrate. Various semiconductor substrate configurations known in the art may be implemented in accordance with the present techniques. For instance, by way of example only, substrate 102 can be a bulk semiconductor (e.g., a bulk Si) wafer. Alternatively, substrate 102 can be a silicon-on-insulator (SOI) wafer. A SOI wafer typically includes a SOI layer separated from a substrate by a buried oxide (or BOX). The configuration of a SOI wafer is generally known in the art, and thus not depicted in the figures. However, one skilled in the art would be able to implement a SOI wafer as substrate 102 in accordance the techniques described herein.

The figures provided herein show both three-dimensional and cross-sectional depictions of the device structures. For reference, FIG. 1 (a three-dimensional representation) shows the orientation of the cross-sectional cuts through the device structure that will be depicted in subsequent figures. Namely, as shown in FIG. 1 cross-sectional cuts through the device structure along line A-A' and along line B-B' will be depicted in subsequent figures.

A stack of selectively etchable materials (i.e., materials that can be etched selective to one another) is next formed on substrate 102. According to an exemplary embodiment, the selectively etchable materials for the stack include silicon nitride (SiN) as a first material and silicon oxide ($SiO_2$) as a second material. Thus, in that case, the stack will include alternating layers of SiN and $SiO_2$. As is known in the art, SiN can be etched selective to $SiO_2$, and vice versa, based on the etch chemistry employed. By way of example only, see C. Reyes-Betanzo et al., "Plasma etching of Silicon Nitride with High Selectivity over Silicon Oxide and Silicon in Fluorine Containing Plasmas," Vac. Sci. Technol. A 17 (6), 3179 (1999); M. Schaepkens et al., "Study of the $SiO_2$-to-$Si_3N_4$ etch selectivity mechanism in inductively coupled fluorocarbon plasmas and a comparison with the $SiO_2$-to-Si mechanism," J. Vac. Sci. Technol. A 17(1), January/February 1999; Lele et al., "Role of $CF_2$ in the etching of $SiO_2$, $Si_3N_4$ and Si in fluorocarbon plasma," Journal of Semiconductors, vol. 30, no. 3 (March 2009)—the contents of each of which are incorporated by reference as if fully set forth herein. In general, however, any combination of selectively etchable materials may be used to form the stack in accordance with the present techniques.

Further, it is notable that while the example shown in the figures consists of a nitride-oxide-nitride (NON) stack, the reverse order (e.g., an oxide-nitride-oxide (ONO)) could also be implemented in the same manner described simply by reversing the order of the selective etching processes employed.

As shown in FIG. 1, this particular example begins by forming a layer 104 of SiN (i.e., the first material in this exemplary NON stack) on the substrate 102. SiN may be deposited using a chemical vapor deposition (CVD) process such as low-pressure chemical vapor deposition (CVD). According to an exemplary embodiment, layer 104 is formed having a thickness of from about 5 nanometers (nm) to about 20 nm, and ranges therebetween.

Figure 2:
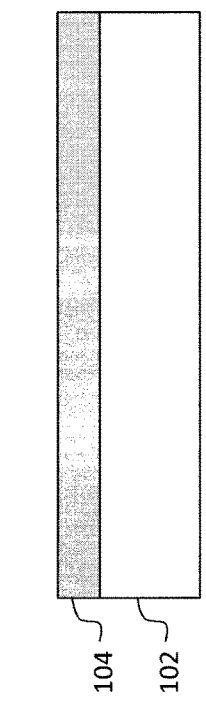
FIG. 2 is a cross-sectional diagram of the structure of FIG. 1 according to an embodiment of the present invention.

FIG. 2 provides a cross-sectional view of a cut through the structure of FIG. 1. At this point in the process, cross-sectional cuts along either line A-A' or B-B' (see, e.g., FIG. 1) appear the same. Thus, what is depicted in FIG. 2 can be a cross-sectional cut through the structure along either line A-A' or B-B'.

Figure 3:
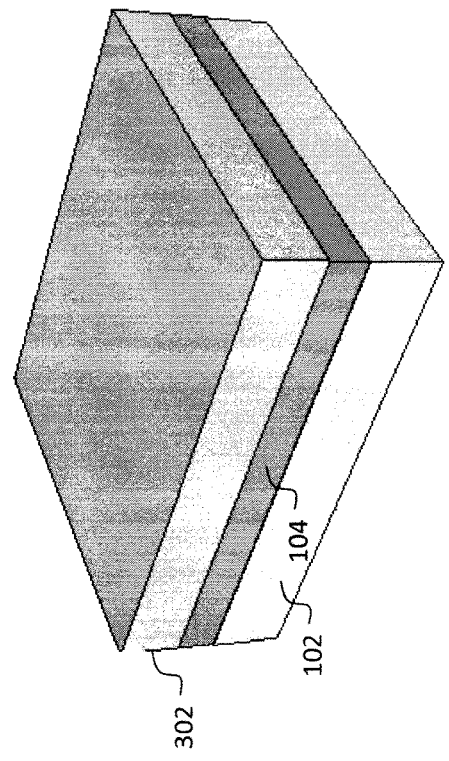
FIG. 3 is a three-dimensional diagram illustrating a layer of a second material (e.g., silicon oxide ($SiO_2$)) having been formed on the layer of the first material according to an embodiment of the present invention.

Next, as shown in FIG. 3, a layer 302 of $SiO_2$ (i.e., the second material in this exemplary NON stack) is formed on the layer 104 (i.e., on a side of the layer 104 opposite the substrate 102). $SiO_2$ may be deposited using a CVD process such as plasma enhanced chemical vapor deposition (PECVD). It is notable that, in this example, portions of layer 302 will be selectively etched away from the stack to form cavities in which the hybrid nanowires will be grown (see below). The height of the cavities will depend on the thickness of layer 302. Thus, the thickness of layer 302 can be selected based on the desired thickness for the nanowires being formed. According to an exemplary embodiment, layer 302 is formed having a thickness of from about 5 nm to about 20 nm, and ranges therebetween.

Figure 4:
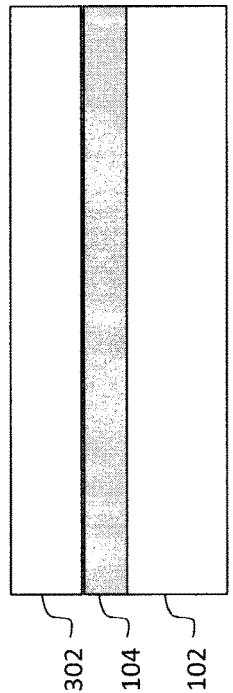
FIG. 4 is a cross-sectional diagram of the structure of FIG. 3 according to an embodiment of the present invention.

FIG. 4 provides a cross-sectional view of a cut through the structure of FIG. 3. At this point in the process, cross-sectional cuts along either line A-A' or B-B' (see, e.g., FIG. 1) appear the same. Thus, what is depicted in FIG. 4 can be a cross-sectional cut through the structure along either line A-A' or B-B'. As shown in FIG. 4, the stack now contains layer 104 (e.g., SiN) and layer 302 (e.g., $SiO_2$).

Figure 5:
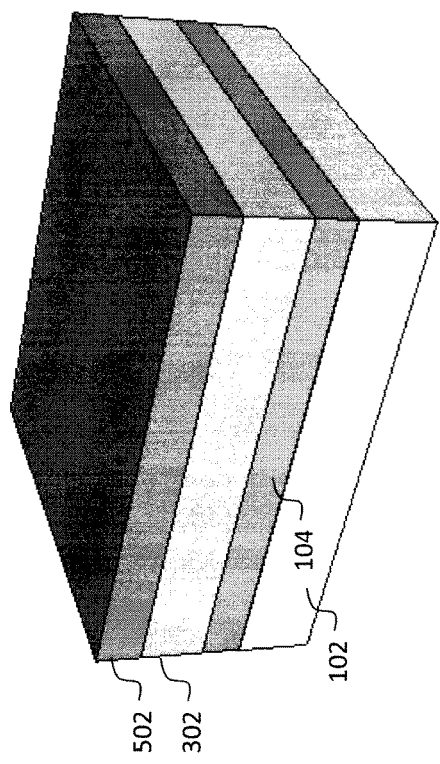
FIG. 5 is a three-dimensional diagram illustrating another layer of a first material (e.g., SiN) having been formed on the layer of the second material to form a (e.g., nitride-oxidenitride) stack of layers on the substrate according to an embodiment of the present invention.

To complete the stack, as shown in FIG. 5 a layer 502 of SiN (i.e., the third material in this exemplary NON stack) is formed on the layer 302 (i.e., on a side of layer 302 opposite layer 104). According to an exemplary embodiment, layer 502 is formed having a thickness of from about 5 nm to about 20 nm, and ranges therebetween.

Figure 6:
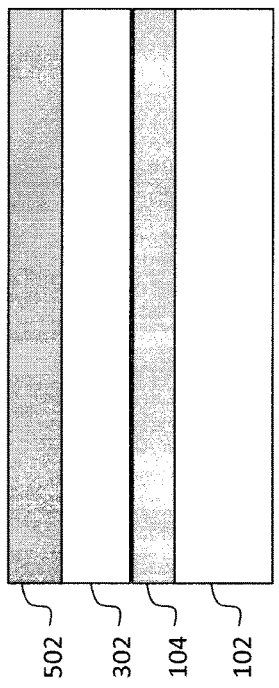
FIG. 6 is a cross-sectional diagram of the structure of FIG. 5 according to an embodiment of the present invention.

FIG. 6 provides a cross-sectional view of a cut through the structure of FIG. 5. At this point in the process, cross-sectional cuts along either line A-A' or B-B' (see, e.g., FIG. 1) still appear the same. Thus, what is depicted in FIG. 6 can be a cross-sectional cut through the structure along either line A-A' or B-B'. As shown in FIG. 6, the stack now contains layer 104 (e.g., SiN), layer 302 (e.g., $SiO_2$), and layer 502 (e.g., SiN)—a NON stack.

Figure 7:
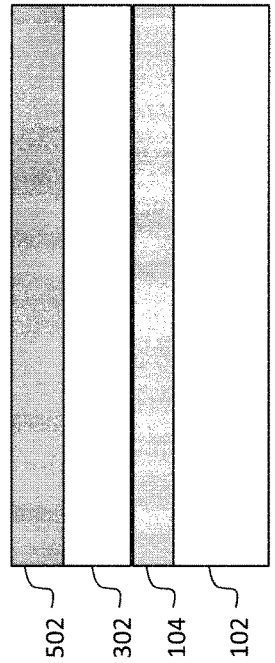
FIG. 7 is a three-dimensional diagram illustrating a first trench and a second trench having been formed in the stack according to an embodiment of the present invention.

As highlighted above, cavities will be selectively formed within the stack and filled with different materials, such that when the stack is removed what remains are nanowires formed from these different materials. To begin this process, trenches are formed in the stack. See FIG. 7. Each of the trenches will be filled (as described below) with one of the materials for forming the nanowires. Thus, in order to fabricate hybrid nanowires (i.e., nanowires formed from at least two different materials), it is preferable to form at least two trenches in the stack. As shown in FIG. 7, each of the trenches extends down to the substrate 102, fully exposing each of the layers of the stack within the trenches. Standard lithography and etching techniques may be used to pattern the trenches in the stack. It is preferable that an anisotropic etching process (such as reactive ion etching (or RIE)) be employed to form the trenches. When RIE is used, it may be necessary to perform a multi-step etching process to pattern the alternating nitride and oxide layers in the stack. For instance, in the case of a NON stack, a nitride-selective RIE may be employed to pattern layer 502 and layer 104, whereas an oxide selective etch may be employed to pattern layer 302. The use of an anisotropic etch minimizes the amount of lateral etching at this stage of the process. Namely, a lateral etch will be performed later to selectively create the cavities in layer 302. However, at this stage, lateral etching of the layers is not desired.

For scaled technologies (e.g., at the 7 nm node or beyond), it may be desirable to use patterning techniques such as sidewall image transfer (or SIT) to form the trenches in the stack. As known in the art, SIT may be employed to pattern features smaller than what is achievable using a lithographically patterned mask. SIT generally involves forming a mandrel, forming spacers on opposite sides of the mandrel, and then removing the mandrel. The spacers then serve as the etching mask. By way of this process, the pitch of the spacers is double that of the mandrel. A suitable SIT process that may be employed in accordance with the present techniques is described in U.S. Patent Application Publication Number 2014/0231913 by Effendi Leobandung, entitled "Trilayer SIT Process with Transfer Layer for FINFET Patterning," the contents of which are incorporated by reference as if fully set forth herein.

It is notable that while the figures depict forming two trenches in the stack, this is merely an example intended to illustrate how the present process can be used to form hybrid nanowires of two different materials. For instance, more than two trenches can be formed at this stage, if so desired, as the basis for creating multiple sets of nanowires. For example, as will be described in detail below, each trench will be the basis for forming two nanowires of the same material. In the present example, one trench will be used to form two nanowires of a first material and the other trench will be used to form two nanowires of a second material. Thus, to use an illustrative example, by doubling the number of trenches one could instead produce four nanowires of each of the first and second materials. Alternatively, one could also in this manner increase the number of trenches to produce hybrid nanowires from more than two materials.

Figure 8:
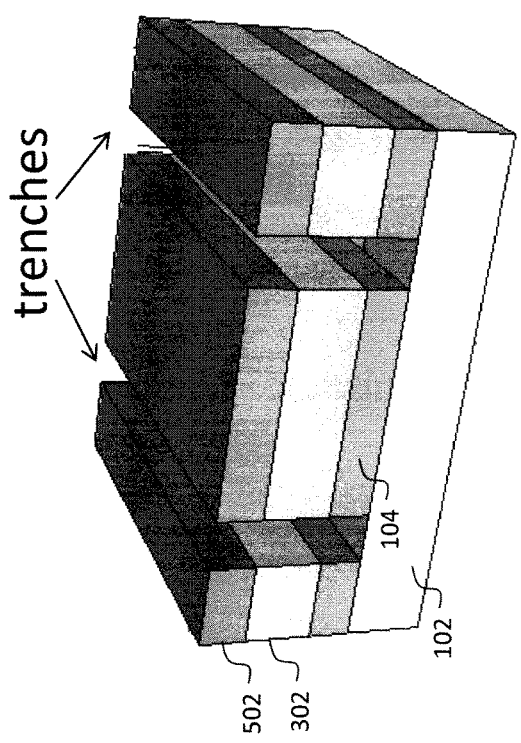
FIG. 8 is a first cross-sectional diagram of the structure of FIG. 7 according to an embodiment of the present invention.
Figure 9:
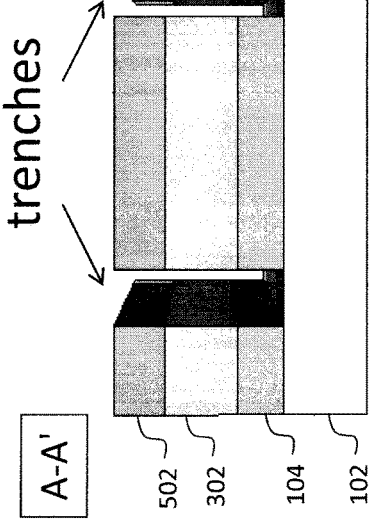
FIG. 9 is a second cross-sectional diagram of the structure of FIG. 7 according to an embodiment of the present invention.

After patterning the trenches, the cross-sectional views through the structure are different. FIG. 8 provides a cross-sectional view of a cut through the structure of FIG. 7 along line A-A' (see, e.g., FIG. 1). As shown in FIG. 8, and as described above, the trenches in this example extend through the stack down to the substrate 102. FIG. 9 provides a cross-sectional view of a cut through the structure of FIG. 7 along line B-B'. In this example, the trenches run parallel to one another in the stack. Thus, the trenches are not visible in cross-sectional view provided in FIG. 9.

Next, a selective masking process is used to block off one trench while nanowires are formed (from a first material) in the other trench, and vice versa. Thus, as shown in FIG. 10 a hardmask (HM) 1002 is next formed filling/blocking off one of the trenches. By way of example only, the hardmask 1002 may be formed by blanket depositing a suitable hardmask material (such as a nitride hardmask material) onto the wafer, filling the trenches. Standard lithography and etching techniques can then be used to pattern the hardmask material such that hardmask 1002 is formed filling/blocking off one of the trenches as shown in FIG. 10.

FIG. 11 provides a cross-sectional view of a cut through the structure of FIG. 10 along line A-A' (see, e.g., FIG. 1). As shown in FIG. 11, one trench is filled/blocked off by the hardmask 1002 (the trench on the right in this example) and the other trench is unmasked/uncovered (the trench on the left in this example). FIG. 12 provides a cross-sectional view of a cut through the structure of FIG. 10 along line B-B' which runs through the hardmask 1002.

Figure 13:
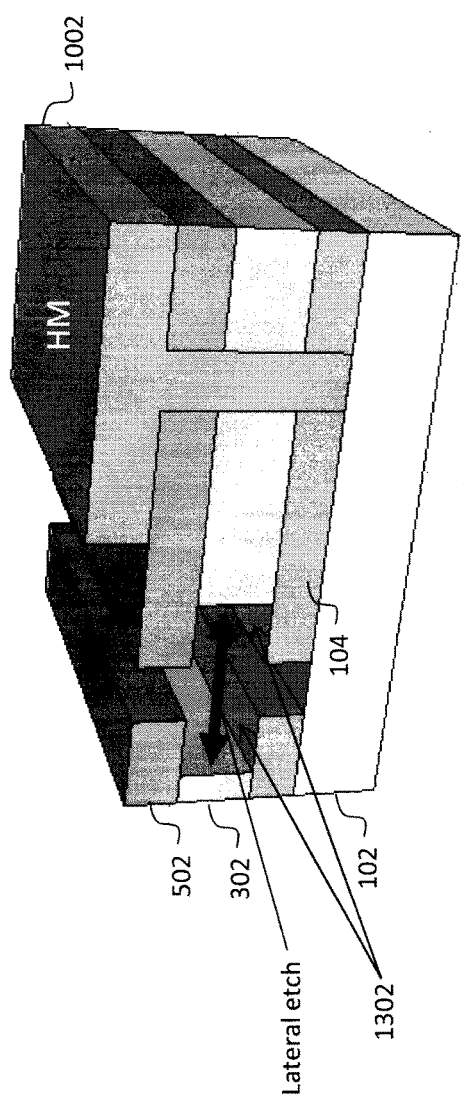
FIG. 13 is a three-dimensional diagram illustrating a selective, lateral etch within the first trench having been used to form first cavities in the layer of the second material adjacent to opposite side of the first trench according to an embodiment of the present invention.

A selective, lateral etch is then performed within the unmasked trench to form cavities 1302 in layer 302 adjacent to opposite side of the unmasked trench. See FIG. 13. The etch used in this step to form the cavities is preferably an isotropic (non-directional) etch that is either oxide or nitride selective (depending on the composition of layer 302 vis-à-vis layers 104 and 502). As provided above, techniques for the selective etching of $SiO_2$ relative to SiN, and vice versa are known in the art. By way of example only, this lateral etching of layer 302 can be performed using an oxide-selective (as in the present NON example) or nitride-selective (e.g., in the case of a ONO stack) (isotropic) wet etching process. As shown in FIG. 13—by removing a portion of layer 302 adjacent to the (unmasked) trench, cavities 1302 are formed on opposite sides of the trench. As such, the cavities 1302 are etched out from a portion of layer 302 of the stack. Access to layer 302 in the stack is provided via the trench. The hardmask 1002 will prevent any of this processing from affecting the layers within the other trench.

Figure 15:
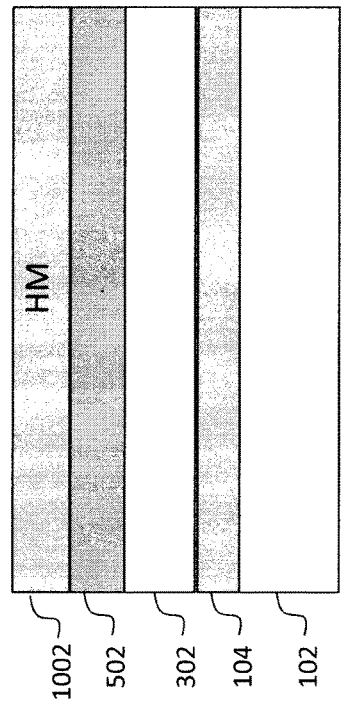
FIG. 15 is a second cross-sectional diagram of the structure of FIG. 13 according to an embodiment of the present invention.
Figure 14:
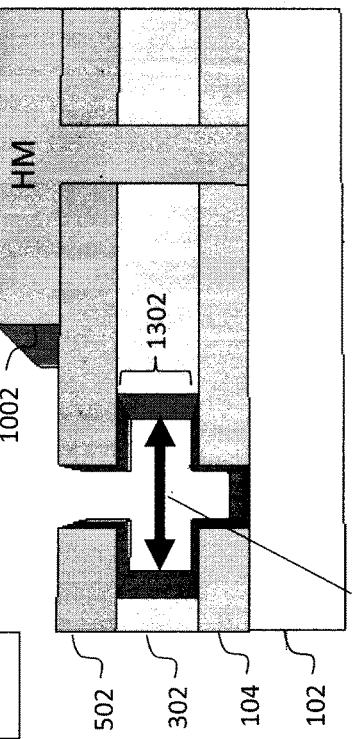
FIG. 14 is a first cross-sectional diagram of the structure of FIG. 13 according to an embodiment of the present invention.

FIG. 14 provides a cross-sectional view of a cut through the structure of FIG. 13 along line A-A' (see, e.g., FIG. 1). As shown in FIG. 14, lateral etching of layer 302 within the unmasked trench forms cavities 1302 in layer 302 on opposite sides of the trench. FIG. 15 provides a cross-sectional view of a cut through the structure of FIG. 13 along line B-B' which runs through the hardmask 1002.

An epitaxial material 1602 is then grown in the unmasked trench from the substrate 102, filling the trench and the cavities 1302. See FIG. 16. In this example, the present techniques are being employed to fabricate hybrid nanowires (i.e., nanowires formed from at least two different materials). In that case, the epitaxial material 1602 grown in this step will serve as the first nanowire material. A second material will be grown in the other trench and will serve as the second nanowire material.

According to an exemplary embodiment, epitaxial material 1602 grown in this step is epitaxial Si, SiGe, or a III-V material. The term III-V material, as used herein, refers to a material that includes at least one group III element and at least one group V element from the periodic table of elements. By way of example only, suitable III-V materials include, but are not limited to, aluminum gallium arsenide (AlGaAs), aluminum gallium nitride (AlGaN), aluminum indium arsenide (AlInAs), aluminum nitride (AlN), gallium antimonide (GaSb), gallium arsenide (GaAs), gallium nitride (GaN), indium antimonide (InSb), indium arsenide (InAs), indium gallium arsenide (InGaAs), indium gallium nitride (InGaN), indium nitride (InN), indium phosphide (InP) and combinations thereof.

As is known in the art, epitaxial materials can be grown from gaseous or liquid precursors. Growth of the epitaxial material up from the substrate means that the crystal lattice of the substrate will act as a template for growth of the epitaxial material within the trench.

Figure 16:
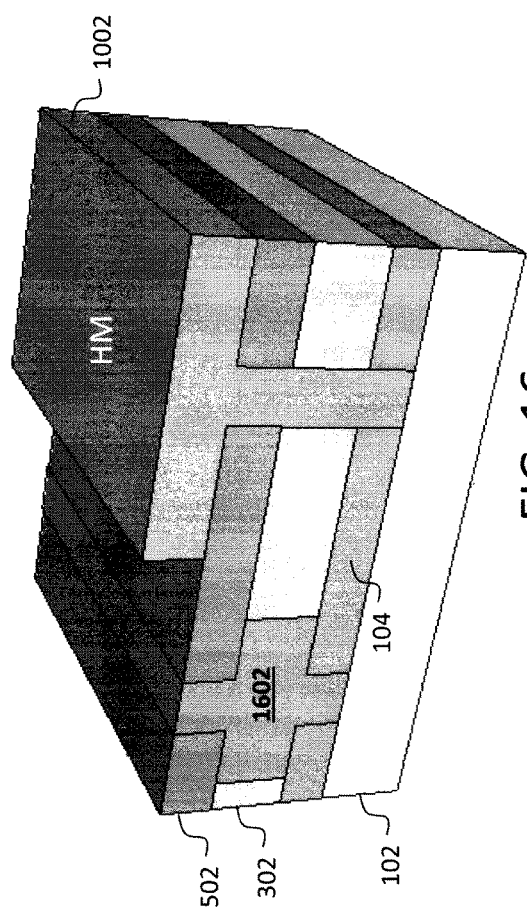
FIG. 16 is a three-dimensional diagram illustrating a first epitaxial material having been grown in the first trench up from the substrate, filling the trench and the first cavities according to an embodiment of the present invention.
Figure 17:
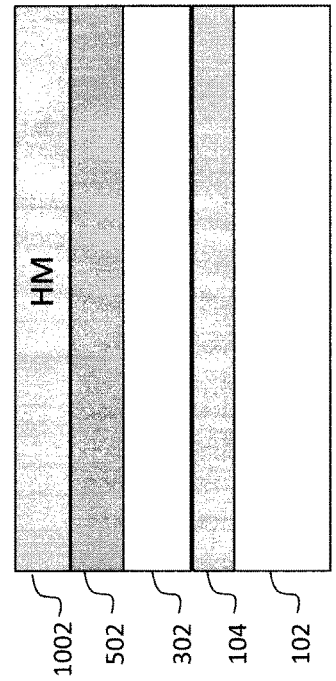
FIG. 17 is a first cross-sectional diagram of the structure of FIG. 16 according to an embodiment of the present invention.
Figure 18:
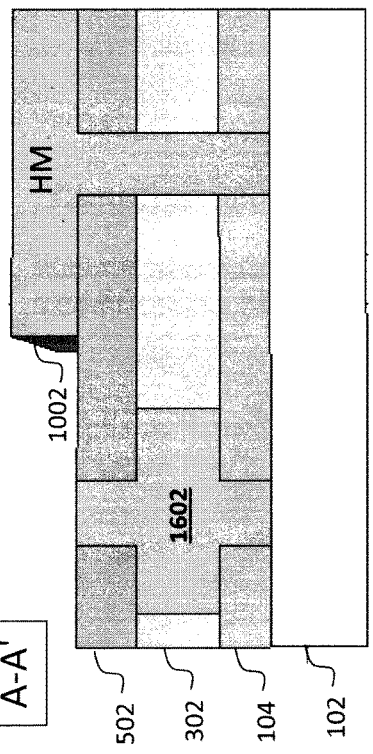
FIG. 18 is a second cross-sectional diagram of the structure of FIG. 16 according to an embodiment of the present invention.

FIG. 17 provides a cross-sectional view of a cut through the structure of FIG. 16 along line A-A' (see, e.g., FIG. 1). As shown in FIG. 17, epitaxial growth from the substrate 102 will serve to fill the trench and cavities 1302 with the epitaxial material 1602. FIG. 18 provides a cross-sectional view of a cut through the structure of FIG. 16 along line B-B' which runs through the hardmask 1002.

In order to form separate and distinct nanowires from the epitaxial material 1602, an etch is next used to remove the epitaxial material 1602 from the (unmasked) trench. See FIG. 19. Preferably, an anisotropic (directional) etching process (such as RIE) is used to remove the epitaxial material 1602 from the trench. This will leave behind the epitaxial material 1602 present in the cavities 1302. Further, use of a selective etch chemistry will permit the trench to be cleared without damaging the surrounding materials.

Figure 19:
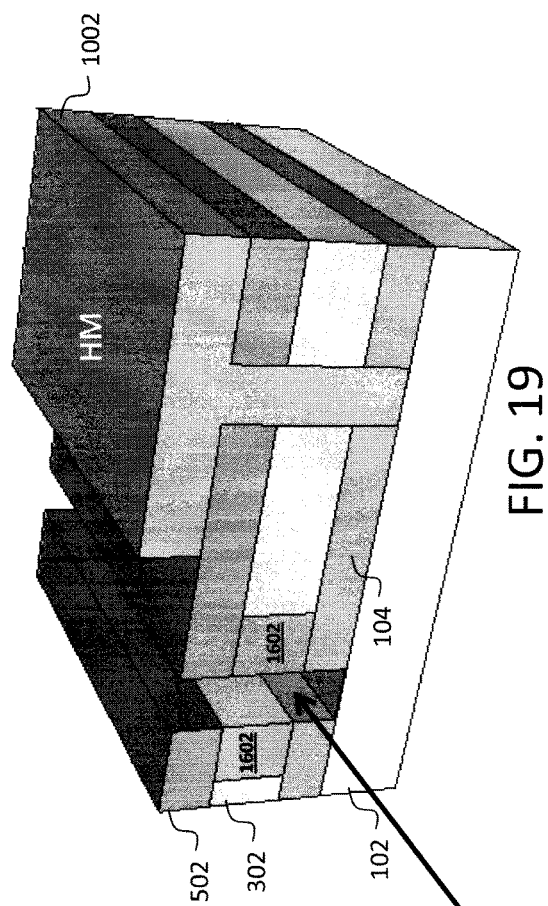
FIG. 19 is a three-dimensional diagram illustrating an etch having been used to remove the first epitaxial material from the first trench leaving behind the first epitaxial material in the cavities according to an embodiment of the present invention.
Figure 20:
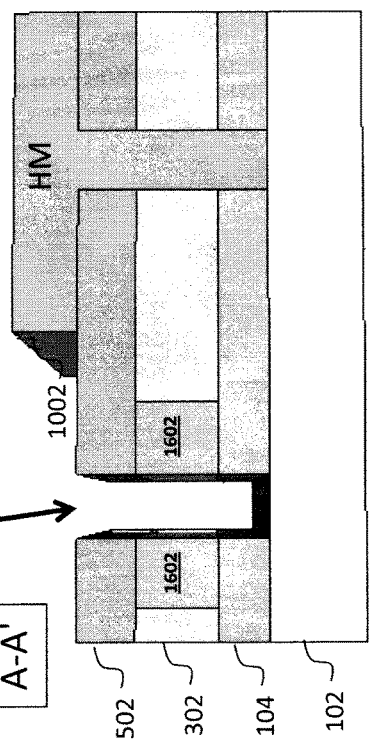
FIG. 20 is a first cross-sectional diagram of the structure of FIG. 19 according to an embodiment of the present invention.
Figure 21:
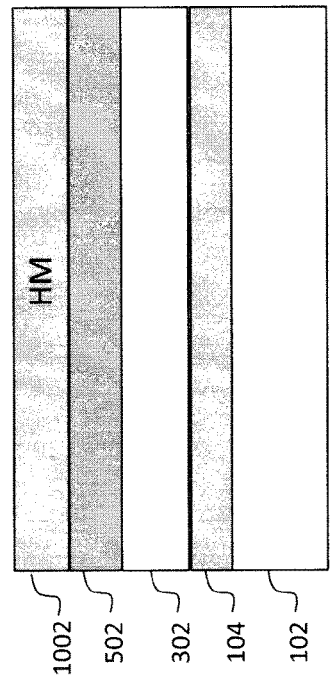
FIG. 21 is a second cross-sectional diagram of the structure of FIG. 19 according to an embodiment of the present invention.

FIG. 20 provides a cross-sectional view of a cut through the structure of FIG. 19 along line A-A' (see, e.g., FIG. 1). As shown in FIG. 20, directional etching of the material within the trench leaves behind the epitaxial material 1602 within the cavities 1302. FIG. 21 provides a cross-sectional view of a cut through the structure of FIG. 19 along line B-B' which runs through the hardmask 1002.

The epitaxial material 1602 remaining in cavities 1302 forms one pair of the hybrid nanowires fabricated in the present process. To form the second pair of the hybrid nanowires, the same process is then performed in the other trench. Namely, the hardmask 1002 is removed from the other trench and, as show in FIG. 22, a second hardmask (HM) 2202 is formed filling/blocking off the first trench (which has just been cleared of the epitaxial material 1602). Hardmask 2202 may be formed in the same manner as hardmask 1002 (see description of FIG. 10 above).

Figure 22:
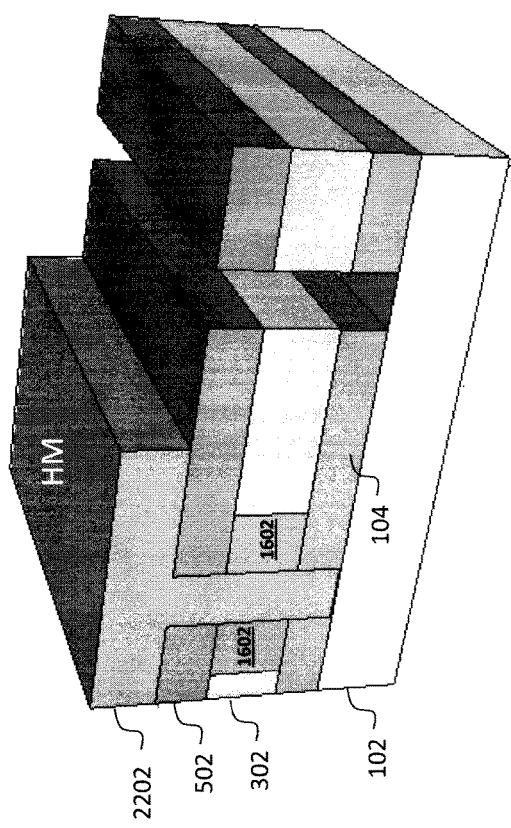
FIG. 22 is a three-dimensional diagram illustrating another hardmask having been formed blocking off the first trench according to an embodiment of the present invention.
Figure 24:
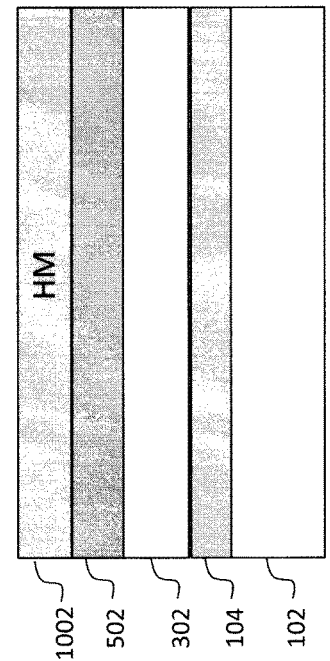
FIG. 24 is a second cross-sectional diagram of the structure of FIG. 22 according to an embodiment of the present invention.
Figure 23:
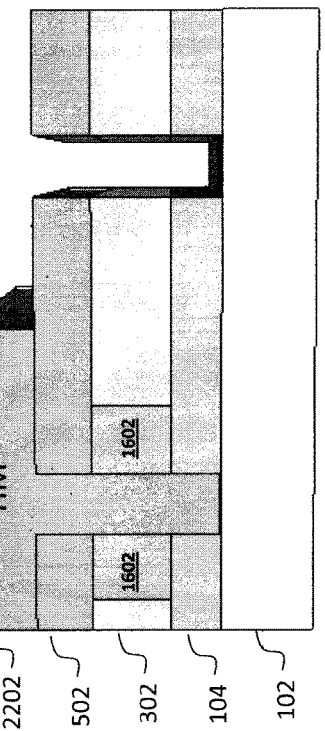
FIG. 23 is a first cross-sectional diagram of the structure of FIG. 22 according to an embodiment of the present invention.

FIG. 23 provides a cross-sectional view of a cut through the structure of FIG. 22 along line A-A' (see, e.g., FIG. 1). As shown in FIG. 23, the first trench is now filled/blocked off by the hardmask 2202 (the trench on the left in this example) and the other trench is unmasked/uncovered (the trench on the right in this example). FIG. 24 provides a cross-sectional view of a cut through the structure of FIG. 22 along line B-B' which runs through the hardmask 2202.

Figure 25:
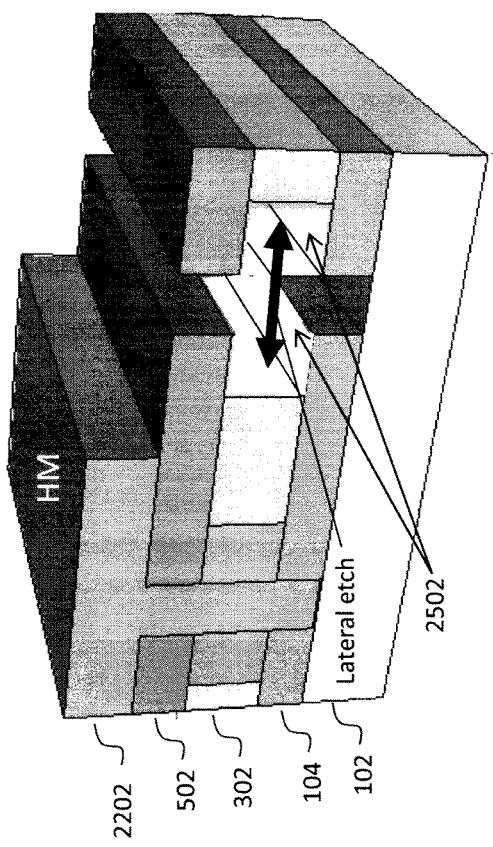
FIG. 25 is a three-dimensional diagram illustrating a selective, lateral etch within the second trench having been used to form second cavities in the layer of the second material adjacent to opposite side of the second trench according to an embodiment of the present invention.

The same process as described above is then used to form cavities 2502 in the other trench. Specifically, a selective, lateral etch is performed within the other trench to form cavities 2502 in layer 302 adjacent to opposite side of the trench. See FIG. 25. As described above, the etch used in this step to form the cavities is preferably an isotropic (non-directional) etch that is either oxide or nitride selective (depending on the composition of layer 302 vis-à-vis layers 104 and 502). As shown in FIG. 25—by removing a portion of layer 302 adjacent to the (currently unmasked) trench, cavities 2502 are formed on opposite sides of the trench.

Figure 27:
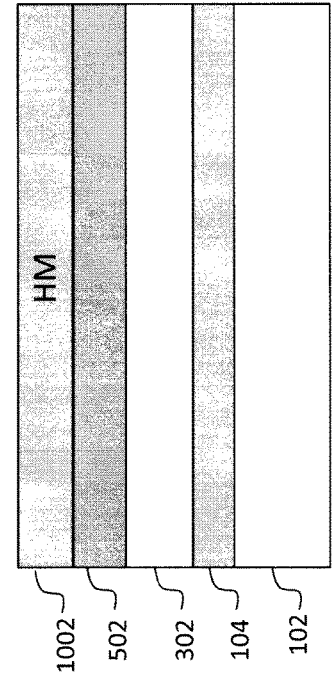
FIG. 27 is a second cross-sectional diagram of the structure of FIG. 25 according to an embodiment of the present invention.
Figure 26:
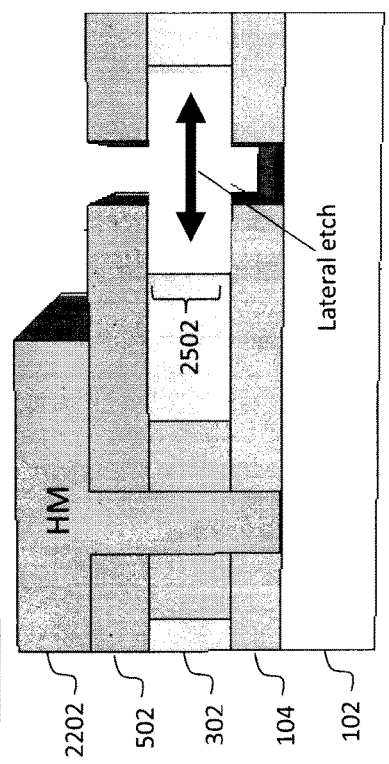
FIG. 26 is a first cross-sectional diagram of the structure of FIG. 25 according to an embodiment of the present invention.

FIG. 26 provides a cross-sectional view of a cut through the structure of FIG. 25 along line A-A' (see, e.g., FIG. 1). As shown in FIG. 26, lateral etching of layer 302 within the currently unmasked trench forms cavities 2502 in layer 302 on opposite sides of the trench. FIG. 27 provides a cross-sectional view of a cut through the structure of FIG. 26 along line B-B' which runs through the hardmask 2202.

An epitaxial material 2802 is then grown in the unmasked trench from the substrate 102, filling the trench and the cavities 2502. As described above, the epitaxial material 2802 is the second nanowire material in this example. In order to fabricate hybrid nanowires (i.e., nanowires formed from at least two different materials), the second nanowire material (i.e., epitaxial material 2502) should be different from the first nanowire material (i.e., epitaxial material 1602). By way of example only, epitaxial material 1602 is an epitaxial material selected from the group including: silicon, germanium, silicon germanium, and a III-V material, and epitaxial material 2802 is another (different) epitaxial material selected from the group including: silicon, germanium, silicon germanium, and a III-V material. Exemplary III-V materials were provided above. For instance, epitaxial material 1602 can be epitaxial Si, while epitaxial material 2802 is epitaxial SiGe, or vice versa.

An etch is then used to remove the epitaxial material 2802 from the (unmasked) trench. Preferably, an anisotropic (directional) etching process (such as RIE) is used to remove the epitaxial material 2802 from the trench. This will leave behind the epitaxial material 2802 present in the cavities 2502. See FIG. 28.

Figure 28:
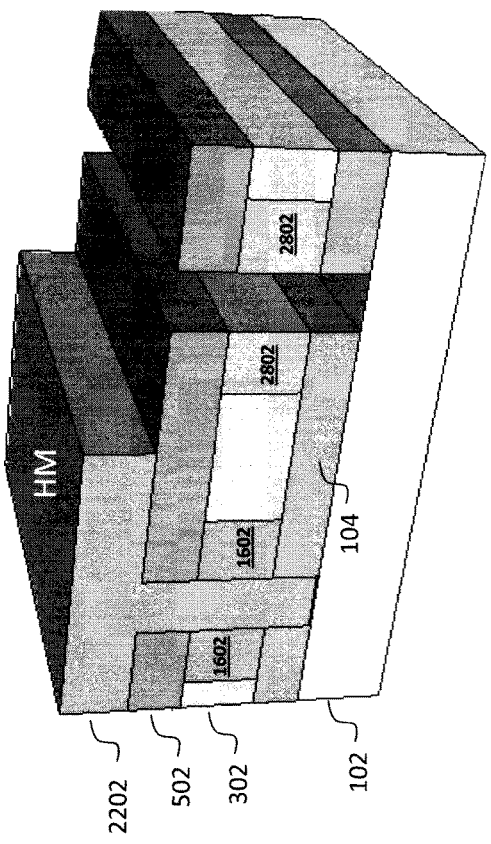
FIG. 28 is a three-dimensional diagram illustrating a second epitaxial material having been grown in the second trench up from the substrate, filling the trench and the second cavities, and an etch having been used to remove the second epitaxial material from the second trench leaving behind the second epitaxial material in the cavities according to an embodiment of the present invention.
Figure 30:
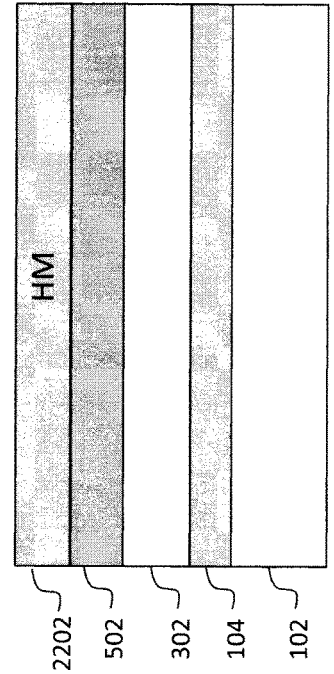
FIG. 30 is a second cross-sectional diagram of the structure of FIG. 28 according to an embodiment of the present invention.
Figure 29:
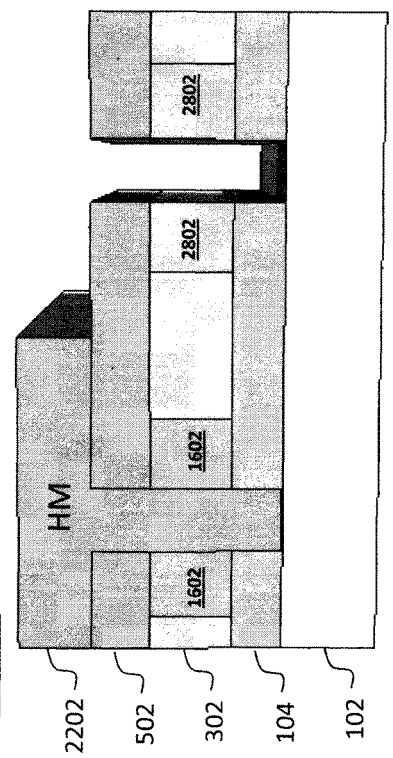
FIG. 29 is a first cross-sectional diagram of the structure of FIG. 28 according to an embodiment of the present invention.

FIG. 29 provides a cross-sectional view of a cut through the structure of FIG. 28 along line A-A' (see, e.g., FIG. 1). As shown in FIG. 29, directional etching of the material within the trench leaves behind the epitaxial material 2802 within the cavities 2502. FIG. 30 provides a cross-sectional view of a cut through the structure of FIG. 28 along line B-B' which runs through the hardmask 2202.

Figure 31:
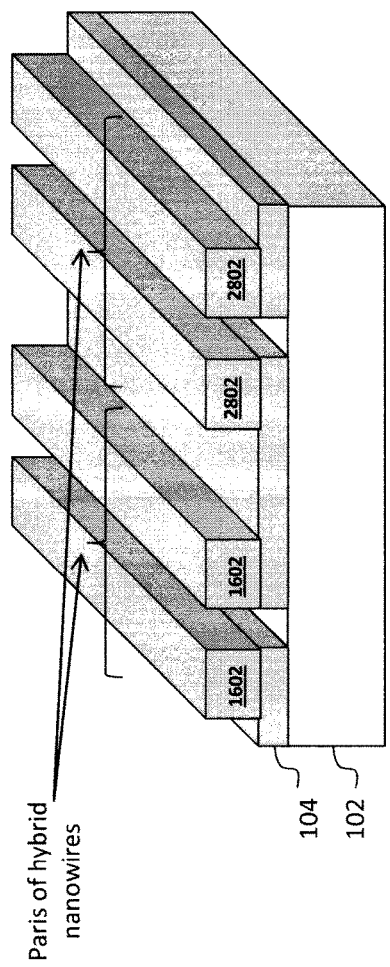
FIG. 31 is a three-dimensional diagram illustrating the hybrid nanowires, now formed, having been released from the stack according to an embodiment of the present invention.

The epitaxial material 2802 remaining in cavities 2502 forms another pair of the hybrid nanowires fabricated in the present process. The hardmask 2202 can then be removed from the first trench. The now-formed nanowires can then be released from the stack by selectively removing layer 502 and the remaining portions of layer 302. See FIG. 31. In the present example, a nitride-selective etching process can be used to remove layer 502, and an oxide-selective etching process can be used to remove layer 302. As shown in FIG. 31, layer 104 anchors the nanowires to the substrate 102, and thus layer 104 can be left in place beneath the nanowires. Depending on the particular application, layer 104 can be selectively removed, undercut, etc. as needed. For instance, undercutting the layer 104 beneath the nanowires can permit a gate electrode (see below) to be formed completely surrounding a portion of each of the nanowires in a gate-all-around or GAA configuration.

Figure 33:
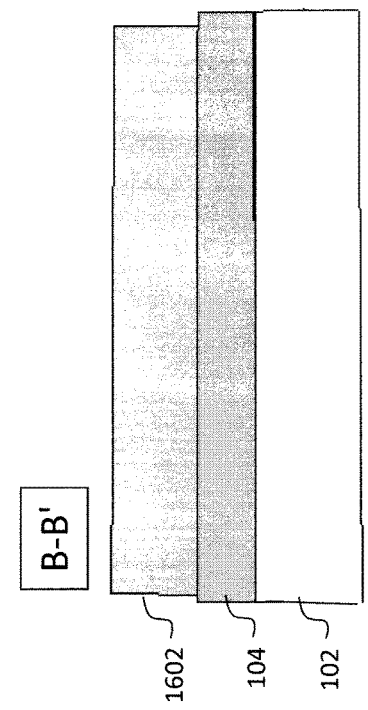
FIG. 33 is a second cross-sectional diagram of the structure of FIG. 31 according to an embodiment of the present invention.
Figure 32:
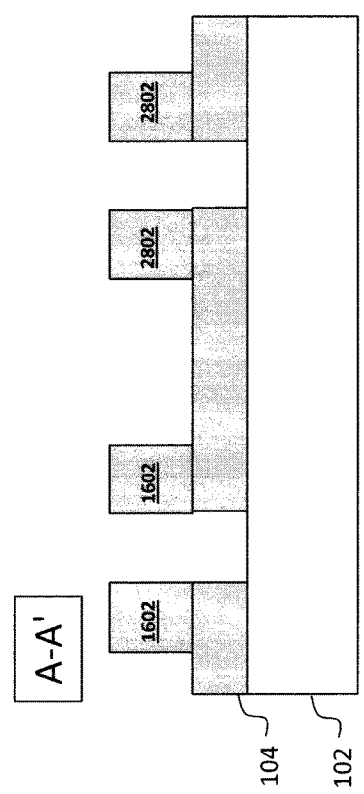
FIG. 32 is a first cross-sectional diagram of the structure of FIG. 31 according to an embodiment of the present invention.

FIG. 32 provides a cross-sectional view of a cut through the structure of FIG. 31 along line A-A' (see, e.g., FIG. 1). As shown in FIG. 32, the nanowires have now been released from the stack. FIG. 33 provides a cross-sectional view of a cut through the structure of FIG. 31 along line B-B' which runs through one of the nanowires.

The hybrid nanowires formed by the above process can then be used in a variety of different device applications. By way of example only, an exemplary process for forming a nanowire-based FET device is now described by way of reference to FIGS. 34-38. A gate-last approach will be used in this example. A gate last approach generally involves using a sacrificial or 'dummy gate' early on the process to locate the source/drain doping etc. The dummy gate serves as placeholder for a replacement gate which will replace the dummy gate later in the process, hence "gate-last." Employing a gate last approach is beneficial since it is compatible with mainstream gate stack materials which can be damaged if placed too early in the process flow. For instance, gate stack materials can be compromised if exposed to the high temperatures often employed to implant/activate the source/drain dopants. With a gate-last approach, the gate stack materials are placed at the end of the process and therefore do not see these high temperatures.

Figure 34:
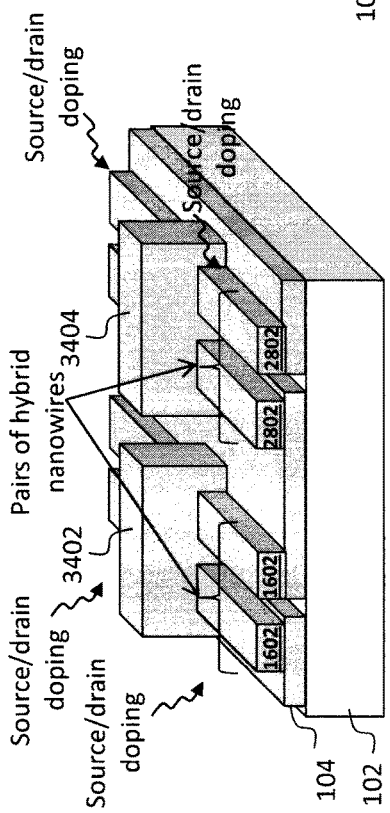
FIG. 34 is a three-dimensional diagram illustrating, according to an exemplary embodiment for forming nanowire field-effect-transistor (FET) devices a first dummy gate having been formed over a first pair of hybrid nanowires and a second dummy gate having been formed over a second pair of hybrid nanowires, and source and drain regions having been formed on opposite sides of the dummy gates according to an embodiment of the present invention.
Figure 37:
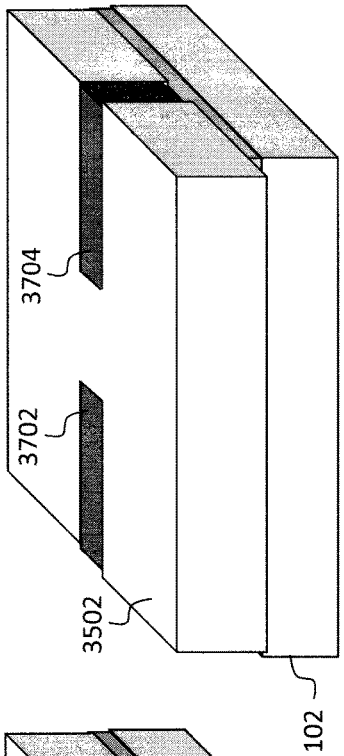
FIG. 37 is a three-dimensional diagram illustrating replacement gates having been formed in the gate trenches according to an embodiment of the present invention.
Figure 36:
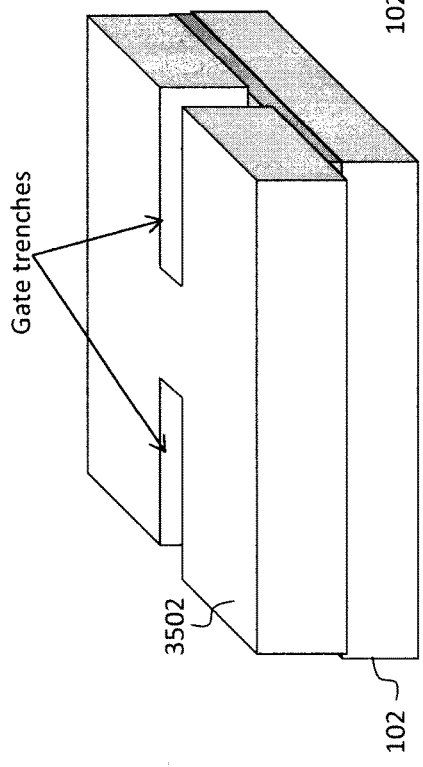
FIG. 36 is a three-dimensional diagram illustrating the dummy gates having been removed selective to the dielectric, forming gate trenches in the dielectric according to an embodiment of the present invention.
Figure 38:
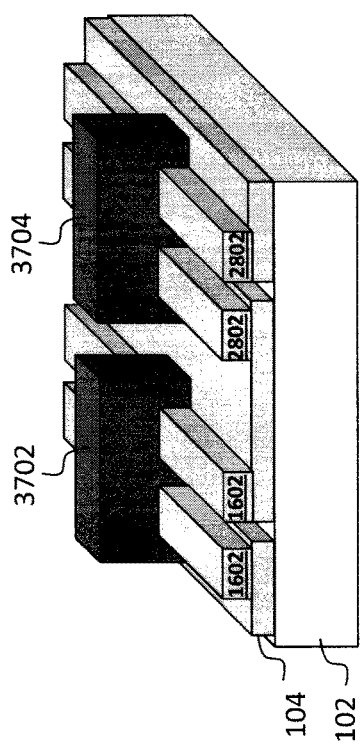
FIG. 38 is a three-dimensional diagram illustrating the dielectric having been removed to reveal the replacement gates over the first and second pairs of nanowires according to an embodiment of the present invention.

As shown in FIG. 34, the process begins with the hybrid nanowires fabricated according to the above-described process. In this example, one pair of the nanowires will be used to form an n-channel nanowire FET and the other pair of nanowires will be used to form a p-channel nanowire FET. As described above, by hybrid it is meant that the nanowires are formed from two different materials. For instance, in this example, one pair of the hybrid nanowires is formed from epitaxial material 1602 and the second pair of hybrid nanowires is formed from a different epitaxial material 2802. See FIG. 34. Suitable materials for forming the nanowires were provided above. Like structures in this example and in the example provided above are numbered alike.

Dummy gates 3402 and 3404 are then formed over the first pair of hybrid nanowires and the second pair of hybrid nanowires, respectively. According to an exemplary embodiment, the dummy gates 3402 and 3404 are formed by first depositing a suitable dummy gate material onto the wafer, covering both pairs of nanowires. Suitable dummy gate materials include, but are not limited to, poly-silicon (Poly-Si). Standard lithography and etching techniques are then used to pattern the dummy gate material into the individual dummy gates 3402 and 3404. The portion of the first pair of nanowires covered by the dummy gate 3402 will serve as a channel region of a first nanowire FET, and the portion of the second pair of nanowires covered by the dummy gate 3404 will serve as a channel region of a second nanowire FET.

The dummy gates can be used to place the source drain doping to form source and drain regions for the respective devices. For instance, the portions of the first pair of nanowires on opposite sides of the dummy gate 3402 will serve as source and drain regions of first nanowire FET, and the portions of the second pair of nanowires on opposite sides of the dummy gate 3404 will serve as source and drain regions of the second nanowire FET. At this point in the process, standard ion implantation techniques can be employed to dope the nanowires in the source and drain regions of the first and second nanowire FETs. Suitable n-type dopants include, but are not limited to phosphorous (P), and suitable n-type dopants include but are not limited to boron (B).

Figure 35:
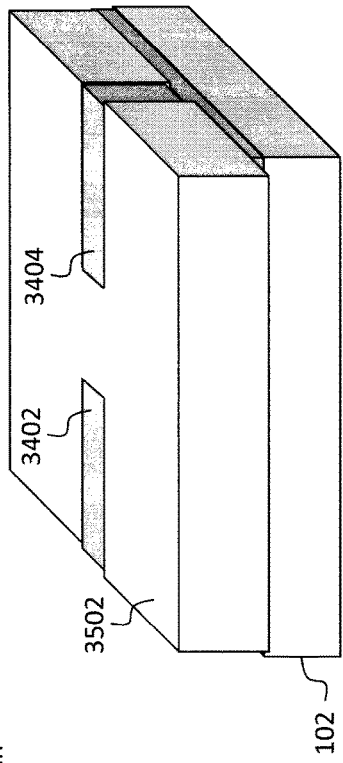
FIG. 35 is a three-dimensional diagram illustrating a dielectric having been deposited onto the wafer, surrounding the first and second dummy gates according to an embodiment of the present invention.

In order to permit removal and replacement of the dummy gates 3402 and 3404, a dielectric 3502 is deposited onto the wafer, surrounding the dummy gates 3402 and 3404. See FIG. 35. As shown in FIG. 35, the dielectric 3502 can be polished/etched to expose the tops of the dummy gates 3402 and 3404.

The dummy gates 3402 and 3404 can then be removed selective to the dielectric 3502, forming gate trenches in the dielectric 3502. See FIG. 36. By way of example only, Poly-Si dummy gates can be removed selective to the dielectric 3502 using a Poly-Si selective etch. As provided above, if so desired the layer 104 can be undercut beneath the nanowire, e.g., so as to permit a GAA device configuration. By way of example only, this undercut etch of the layer 104 can be performed in the channel regions after removal of the dummy gates, and can be accomplished using, e.g., a nitride-selective etch. Following removal of the dummy gates 3402 and 3404, replacement gates 3702 and 3704 can be formed in the gate trenches. See FIG. 37. As with the dummy gates, replacement gate 3702 covers the portions of the first pair of nanowires that will serve as the channel region of the first nanowire FET, and replacement gate 3704 covers the portions of the second pair of nanowires that will serve as the channel region of the second nanowire FET.

By way of example only, the replacement gates 3702 and 3704 are formed by depositing a suitable gate stack material or materials into the gate trenches over the nanowires. As is known in the art, FET gate stacks commonly include one or more gate conductors separated from the channel region by a gate dielectric. Suitable gate conductors include, but are not limited to, doped Poly-Si or a gate metal or combination of gate metals such as nickel (Ni), platinum (Pt), palladium (Pd), etc. Suitable gate dielectrics include, but are not limited to, SiO$_2$, hafnium oxide (HfO$_2$), lanthanum oxide (LaO$_2$), etc.

Figure 39:
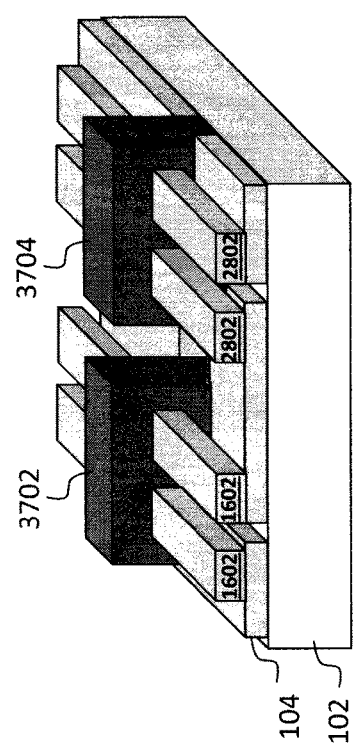
FIG. 39 is a three-dimensional diagram illustrating the dielectric having been removed to reveal the replacement gates surrounding a portion of each of the first and second pairs of the nanowires in a gate-all-around (GAA) configuration according to an embodiment of the present invention.

Finally, the dielectric 3502 can be removed to reveal the replacement gates 3702 and 3704 over the first and second pairs of nanowires, respectively. See FIG. 38. According to an exemplary embodiment, epitaxial material 1602 is Si and epitaxial material 2802 is SiGe, and the first nanowire FET is an n-channel FET and the second nanowire FET is a p-channel FET. However, this is merely an example, and any combination of the above-described hybrid nanowire materials may be used in accordance with the present techniques. FIG. 39 depicts the alternative case where undercutting of the layer 104 was performed permitting a GAA configuration. Here the replacement gates 3702 and 3704 surround a portion of each of the first and second pairs of nanowires, respectively.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A nanowire field-effect transistor (FET) device, comprising:
   at least one first pair of nanowires and at least one second pair of nanowires on a substrate, wherein the at least one first pair of nanowires comprises a different material than the at least one second pair of nanowires; and
   a first gate over a portion of the at least one first pair of nanowires that serves as a channel region of a first nanowire FET and a second gate over a portion of the at least one second pair of nanowires that serves as a channel region of a second nanowire FET, wherein portions of at least one first pair of nanowires on opposite sides of the first gate serve as source and drain regions of the first nanowire FET, and wherein portions of at least one second pair of nanowires on opposite sides of the second gate serve as source and drain regions of the second nanowire FET,
   wherein the at least one first pair of nanowires comprises a material selected from the group consisting of: epitaxial silicon, epitaxial germanium, epitaxial silicon germanium, and an epitaxial III-V material, and wherein the at least one second pair of nanowires comprises another material selected from the group consisting of: epitaxial silicon, epitaxial germanium, epitaxial silicon germanium, and an epitaxial III-V material, wherein the at least one first pair of nanowires and the at least one second pair of nanowires are separated from the substrate by a layer comprising silicon nitride or silicon oxide, wherein the layer is in direct contact with the at least one first pair of nanowires in the source and drain regions of the first nanowire FET, and wherein the layer is in direct contact with the at least one second pair of nanowires in the source and drain regions of the second nanowire FET.

2. The nanowire FET device of claim 1, wherein the substrate comprises a silicon substrate.

3. The nanowire FET device of claim 1, wherein the epitaxial III-V material comprises a material selected from the group consisting of: aluminum gallium arsenide (Al- GaAs), aluminum gallium nitride (AlGaN), aluminum indium arsenide (AlInAs), aluminum nitride (MN), gallium antimonide (GaSb), gallium arsenide (GaAs), gallium nitride (GaN), indium antimonide (InSb), indium arsenide (InAs), indium gallium arsenide (InGaAs), indium gallium nitride (InGaN), indium nitride (InN), indium phosphide (InP), and combinations thereof.

4. The nanowire FET device of claim 1, wherein the at least one first pair of nanowires comprises epitaxial silicon, and wherein the at least one second pair of nanowires comprises epitaxial silicon germanium.

5. The nanowire FET device of claim 1, wherein the first nanowire FET comprises an n-channel nanowire FET, and wherein the second nanowire FET comprises a p-channel nanowire FET.

6. The nanowire FET device of claim 1, wherein the first gate surrounds a portion of each of the at least one first pair of nanowires in a gate-all-around configuration.

7. The nanowire FET device of claim 1, wherein the second gate surrounds a portion of each of the at least one second pair of nanowires in a gate-all-around configuration.

8. The nanowire FET device of claim 1, wherein the layer has a thickness of from about 5 nanometers to about 20 nanometers, and ranges therebetween.

9. The nanowire FET device of claim 1, wherein the layer is in direct contact with the at least one first pair of nanowires in the channel region of the first nanowire FET, and wherein the layer is in direct contact with the at least one second pair of nanowires in the channel region of the second nanowire FET.

10. The nanowire FET device of claim 1, wherein the layer is undercut beneath the at least one first pair of nanowires in the channel region of the first nanowire FET, and wherein the layer is undercut beneath the at least one second pair of nanowires in the channel region of the second nanowire FET.

11. The nanowire FET device of claim 1, wherein at least one first trench is present in the layer between the at least one first pair of nanowires.

12. The nanowire FET device of claim 11, wherein at least one second trench is present in the layer between the at least one second pair of nanowires.

13. The nanowire FET device of claim 1, wherein the first gate and the second gate each comprises at least one gate conductor separated from the channel region of the first nanowire FET and the channel region of the second nanowire FET by a gate dielectric.

14. The nanowire FET device of claim 13, wherein the gate conductor comprises doped poly-silicon.

15. The nanowire FET device of claim 13, wherein the gate conductor comprises a metal.

16. The nanowire FET device of claim 15, wherein the metal is selected from the group consisting of: nickel (Ni), platinum (Pt), and palladium (Pd).

17. The nanowire FET device of claim 13, wherein the gate dielectric is selected from the group consisting of: silicon oxide ($SiO_2$), hafnium oxide ($HfO_2$), and lanthanum oxide ($LaO_2$).

18. The nanowire FET device of claim 1, wherein the source and drain regions of the first nanowire FET and the source and drain regions of the second nanowire FET are each doped with an n-type or p-type dopant.

* * * * *